United States Patent [19]

Nagai et al.

[11] 4,426,704
[45] Jan. 17, 1984

[54] SEMICONDUCTOR LASER WITH TWO ACTIVE LAYERS

[75] Inventors: Haruo Nagai, Tanashi; Yoshio Noguchi, Higashikurume; Kenichiro Takahei, Seki, all of Japan

[73] Assignee: Nippon Telegraph & Telephone Public Corporation, Tokyo, Japan

[21] Appl. No.: 317,592

[22] Filed: Nov. 2, 1981

[30] Foreign Application Priority Data

Nov. 11, 1980 [JP] Japan ............................. 55-158732

[51] Int. Cl.³ .............................................. H01S 3/19
[52] U.S. Cl. ...................................... 372/50; 357/17; 372/46
[58] Field of Search ....................... 372/44, 45, 46, 50; 357/17

[56] References Cited

U.S. PATENT DOCUMENTS 4,318,059 3/1982 Lang et al. ............................. 372/47

Primary Examiner—James W. Davie
Attorney, Agent, or Firm—Frishauf, Holtz, Goodman & Woodward

[57] ABSTRACT

In a semiconductor laser, a laminated multi-layer body is on a prescribed region of the surface of a semiconductor substrate of first conductivity type, and a burying laminated layer body surrounds the laminated layer body in contact with the lateral wall thereof. The laminated layer body includes a first cladding layer having the first conductivity type, a first active layer, a second cladding layer having the opposite conductivity type (second conductivity type) to that of the semiconductor substrate, a second active layer and a third cladding layer of the first conductivity type. The burying laminated layer body includes a semiconductor electrode layer of the second conductivity type and low specific resistivity which substantially contacts the second cladding layer, and two groups of burying layers respectively provided on the prescribed regions of the top and bottom surface of said semiconductor electrode layer. When a prescribed amount of direct current is supplied to a first electrode mounted on the upper side of the laminated layer body, a second electrode deposited on the bottom side of said laminated layer body and a third electrode set on the semiconductor electrode layer included in the burying layer body, then the first and second active layers arranged very close to each other simultaneously oscillate two independent laser beams admitting of modulation with a low threshold current value.

19 Claims, 5 Drawing Figures

SEMICONDUCTOR LASER WITH TWO ACTIVE LAYERS

BACKGROUND OF THE INVENTION

This invention relates to a semiconductor laser having a buried heterostructure and more particularly to a semiconductor laser capable of oscillating two independent laser beams admitting of modulation.

Already known is a light-emitting diode device wherein a single semiconductor element enables multiple light beams having different wavelengths to be simultaneously emitted, for example, "Multi color light-emitting diodes" set forth in the U.S. Pat. No. 3,611,069. With a semiconductor element disclosed in this literature, two closely arranged light beams having different colors are simultaneously issued from the PN junction. However, this disclosed device is not adapted to be used intact with a semiconductor laser, because current tends to be dispersed. Another known 2-wavelength type semiconductor laser is that which is disclosed in the literature "Appl. Phys. Lett 35 (8) 15 Oct., 1979" page 588 (FIG. 1). This proposed device, too, has the drawbacks that an oscillation threshold current tends to rise, presenting difficulties in the room temperature operation; and two laser beams oscillated from an active layer are spaced from each other at a wide interval, failing to be conducted into a single optical fiber bundle at the same time. Therefore, a single semiconductor laser alone cannot provide a transmitter used in the so-called wavelength-multiplexing optical transmission intended to increase an amount of transmission by simultaneously transmitting optical signals having two or more wavelengths. Consequently it is indispensable to apply a wave collector. Further where the above-mentioned transmitter is to be formed of semiconductor laser units, each of which oscillates only one laser beam, then it is necessary to provide a prism or interference filter for collecting laser beams emitted from these plural semiconductor laser units. However, any type of conventional transmitter has the drawback that it inevitably assumes an enlarged size due to the necessity of providing a wave collector. Moreover, such a transmitter provided with a wave collector has the defects that when the waves of laser beams are collected by the wave collector, then laser beams tend to be lost in the region of said wave collector; and a distance of transmission has to be shortened. Therefore, a conventional semiconductor laser has presented difficulties in constructing a compact wavelength-multiplexing optical transmitter which dispenses with a wave collector and minimizes the loss of laser beams.

Further, where the conventional semiconductor laser emitting a single laser beam is used as an optical transmitter, then the difficulties arise that if the semiconductor laser should fail, a fresh semiconductor laser has to be installed, and the repair of the defective semiconductor laser consumes a great deal of time.

SUMMARY OF THE INVENTION

It is accordingly an object of this invention to provide a semiconductor laser capable of oscillating two laser beams having different wavelengths with a low threshold current.

Another object of the invention is to provide a semiconductor laser capable of simultaneously oscillating two laser beams having different wavelengths at room temperature.

Still another object of the invention is to provide a semiconductor laser whose active layers can oscillate two independent laser beams admitting of modulation at an extremely short distance.

A further object of the invention is to provide a compact semiconductor laser which dispenses with a wave collector, minimizes the loss of laser beams and is adapted to be used with a wavelength-multiplexing optical transmitter.

A still further object of the invention is to provide a semiconductor laser which is provided with two active layers, and makes it possible to utilize a laser beam issued from one of said two activated layers as a spare.

To attain the above-mentioned objects, this invention provides a semiconductor laser which comprises:

a semiconductor substrate of one conductivity type;

a laminated layer body formed of a first cladding layer of a first conductivity type, first active layer, second cladding layer having the opposite conductivity type to said first conductivity type, second active layer and third cladding layer of the first conductivity type all laminated in the order mentioned on the prescribed region of the semiconductor substrate as counted from the surface thereof; and a burying laminated layer body which surrounds the aforesaid laminated layer body in contact therewith and is formed of a first burying layer, semiconductor electrode layer of a second conductivity type and second burying layer all laminated in the order mentioned on the semiconductor substrate as counted from the surface thereof, and which is characterized in that the semiconductor electrode layer is set substantially in contact with the second cladding layer and has a low specific resistivity; the third cladding layer is provided with a first electrode; the semiconductor substrate is provided with a second electrode; the semiconductor electrode layer is provided with a third electrode; and said semiconductor laser is provided with power supply means which is formed of a first power source connected between the first and third electrodes and a second power source connected between the second and third electrodes.

The first burying layer may be constructed by superposing the second semiconductor layer of the first conductivity type on the first semiconductor layer of the second conductivity type with a PN junction, or said first burying layer may be formed of a high resistance semiconductor layer. The second burying layer may be constructed by superposing a fourth semiconductor layer of the second conductivity type on the third semiconductor layer of the first conductivity type with a PN junction, or said second burying layer may be formed of a high resistance semiconductor layer.

DETAILED DESCRIPTION OF THE PREFERRED EMBODIMENTS

Figure 1:
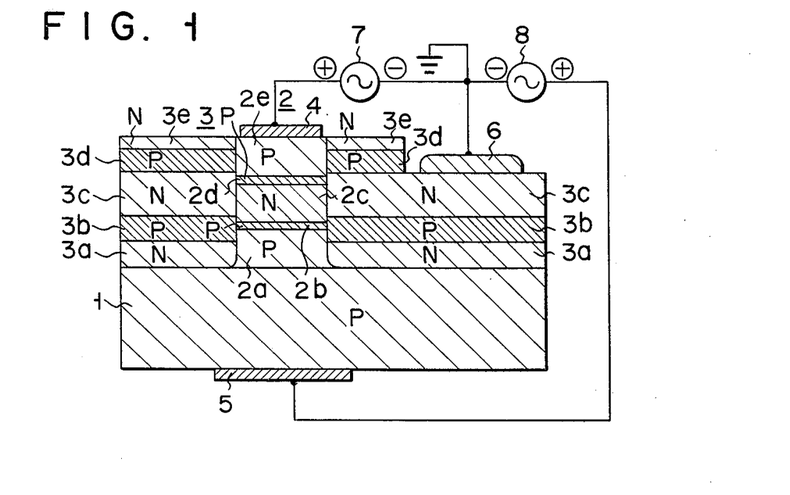
FIG. 1 is a cross sectional view of a semiconductor laser embodying this invention, showing the connection of the respective electrodes to the power sources.

Description is now given with reference to the accompanying drawing of a semiconductor laser according to one embodiment of this invention. As shown in FIG. 1, a laminated layer body 2 is formed on the prescribed region of the main surface of a semiconductor substrate 1. A burying laminated layer body 3 is formed in the prescribed region of the main surface of the semiconductor substrate 1 in a state surrounding the lateral wall of the aforementioned laminated layer body 2.

The semiconductor substrate 1 is formed of a P type semiconductor containing the crystals of the compounds of Groups III and V of the periodic Table such as InP or GaAs.

The laminated layer body 2 is constructed by laminating by liquid or gas phase growth a first cladding layer 2a, first active layer 2b, second cladding layer 2c, second active layer 2d and third cladding layer 2e on the main surface of the semiconductor substrate 1 as counted from said surface.

The first cladding layer 2a and third cladding layer 2e are P type semiconductor layers prepared from the same material as the semiconductor substrate 1. Where the semiconductor substrate 1 is formed of crystals of InP, then the first active layer 2b and second active layer 2d are formed of quarternary crystals of GaInAsP. Where the semiconductor substrate 1 is formed of GaAs, then the first, second and third cladding layers are respectively formed of GaAlAs, and the first and second active layers are respectively formed of GaAs or GaAlAs. The second cladding layer 2c interposed between the first and second active layers 2b, 2d are formed of N type semiconductor layers prepared from the same material as the semiconductor substrate 1.

Figure 2:
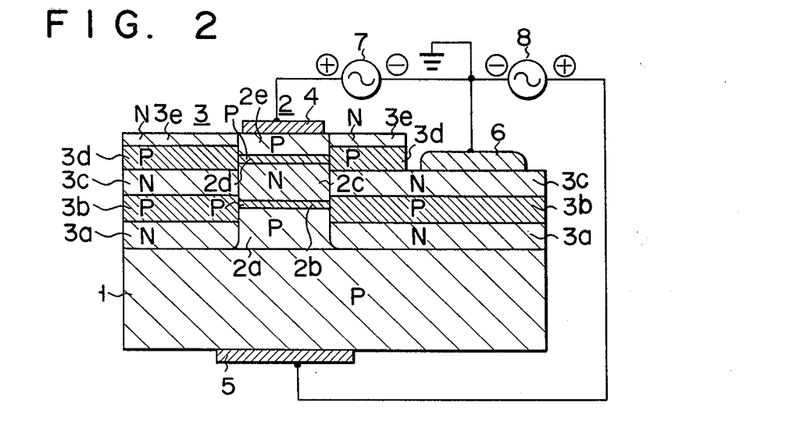
FIG. 2 is a cross sectional view of a semiconductor layer embodying the invention which has a particularly preferred arrangement, showing the connection of the respective electrodes to the power sources.

A mask prepared from, for example, a silicon dioxide (SiO$_2$) layer, aluminium oxide layer (Al$_2$O$_3$), or silicon nitride (Si$_3$N$_4$) layer is formed by, for example, sputtering or chemical vapor deposition (CVD) on the surface of the third cladding layer 2e constituting the uppermost layer of the laminated layer body 2. After patterning is applied to the mask by photolithography, etching is carried out to retain the first to the third cladding layers 2a, 2c, 2e and first and second active layers 2d, 2b all lying under the mask, thereby producing a laminated layer body 2 (FIG. 2).

A first semiconductor layer 3a, second semiconductor layer 3b, semiconductor electrode layer 3c, third semiconductor layer 3d and fourth semiconductor layer 3e are laminated by liquid or gas growth on the surface of the semiconductor body 1 exposed by etching carried out in the formation of the laminated layer body 2, thereby providing a burying laminated layer body 3.

The semiconductor electrode layer 3c has its thickness so defined that said electrode layer 3c substantially contacts the lateral wall of the second cladding layer 2c in order to provide a current path. Said semiconductor electrode layer 3c has an N type conductivity opposite to the conductivity type of the semiconductor substrate 1, and is formed of, for example, crystals of GaInAsP, InP, GaAs or GaAlAs. Where the semiconductor electrode 3c is formed of, for example, GaInAsP, then etching little proceeds on the surface of the semiconductor electrode layer 3c when part of the second burying layers 3d, each formed of InP is etched in order to provide the later described third electrode 6, thereby offering great convenience in the formation of an element.

The semiconductor electrode layer 3c has a carrier density of about $2 \times 10^{18}$ cm$^{-3}$, namely, has as low a specific resistivity as 0.003 Ω.cm, and plays the part of a current path. The first and second active layers 2b, 2d have a narrow forbidden band gap, whereas the semiconductor electrode layer 3c has a wider forbidden band gap. Therefore, said seimconductor electrode layer 3c is preferred to have a smaller refractive index than the first and second active layers 2b, 2d. Where the semiconductor electrode 3c is allowed to have a large forbidden band gap and small refractive index, then the following advantages are assured that if part of the semiconductor electrode layer 3c should contact the first and second active layers 2b, 2d due to errors in manufacturing a semiconductor element, then the semiconductor electrode layer 3c can effectively shut off a current path and light path; and consequently even if the semiconductor electrode layer 3c fully contacts the second cladding layer, it is possible to effectively prevent the leakage of a light from the first and second active layers 2b, 2d.

The burying laminated layer body 3 comprises the semiconductor electrode layer 3c, first group of burying layers 3a, 3b contacting the prescribed region of the bottom surface of said semiconductor electrode layer 3c and second group of burying layers 3d, 3e contacting the prescribed region of the upper surface of said semiconductor electrode layer 3c. The first group of burying layers 3a, 3b is formed of a first N type semiconductor layer 3a and a second P Type semiconductor layer 3b jointly constituting a PN-junction. The second group of burying layers 3d, 3e is formed of a third P type semiconductor layer 3d and a fourth N type semiconductor layer 3e, jointly constituting a PN junction. From an idealistic point of view, it is preferred as shown in FIG. 2 that the first group of burying layers 3a, 3b be made to contact the first cladding layer 2a and first active layer 2b; and the second group of burying layers 3d, 3e be made to contact the second active layer 2d and third cladding layer 2e. Where current happens to flow through the semiconductor electrode layer 3c, then the above-mentioned PN junctions respectively act to restrict the passage of current through the first and second groups of burying layers 3a-3b and 3d-3e by utilizing the back bias of said PN junctions. The first and second groups of burying layers 3a-3b and 3a-3e also act to confirn a laser beam in the corresponding first and second active layers 2b, 2d.

Where the semiconductor electrode layer 3c is formed of crystals of GaInAsP, then the two groups of burying layers 3a-3b and 3d-3e are formed of crystals of InP. Where the semiconductor electrode layer 3c is formed of crystals of GaAs or GaAlAs, then the two groups of burying layers 3a-3b and 3d-3e are respectively formed of crystans of GaAlAs.

Where a semiconductor element embodying this invention is formed of a system of GaAs/GaAlAs, and the two groups of burying layers 3a-3b and 3d-3e are formed of crystals of GaAlAs, then it is possible to prevent the flow of current into said groups of burying layers 3a-3b and 3d-3e by a high resistance layer prepared from GaAlAs even with out causing said two groups of burying layers 3a-3b and 3d-3e to jointly constitute a PN junction. Where a semiconductor layer is formed of InP/GaInAsP, then said two groups of burying layers 3a-3b and 3d-3e may be respectively formed of a semiconductor layer of high resistivity.

The fourth semiconductor layer 3e and the third semiconductor layer 3d are partly etched off to expose part of the surface of the semiconductor electrode layer 3c. With the laminated layer body 2 and burying laminated layer body 3 both constructed as described above, it is preferred that the lattice constant of the semiconductor electrode layer 3c be made to coincide with those of the first, second and third cladding layers 2a, 2c, 2e and two groups of burying layers 3a-3b and 3d-3e.

The first and second active layers 2b, 2d each has a narrower forbidden band gap than those of the first to the third cladding layers 2a, 2c, 2e and the first and second groups of burying layers 3a-3b and 3d-3e, and further have a larger refractive index than these listed layers, thereby facilitating the oscillation of laser beams.

The first electrode 4 is mounted on the exposed surface of the uppermost third cladding layer 2e of the laminated layer body 2. The second electrode 5 is fitted to the backside of the semiconductor substrate 1. The third electrode 6 is set on the exposed surface of the semiconductor electrode layer 3c.

The first power source 7 is connected between the first electrode 4 and the third electrode 6. In this case, the side of the first electrode 4 is taken to denote a positive potential, and the side of the third electrode 6 is taken to represent a negative potential.

A second power source 8 is connected between the second electrode 5 and third electrode 6. In this case, the side of the second electrode 5 is taken to have a positive potential, and the side of the third electrode 6 is taken to have a negative potential. The negative potential sides of the first and second power sources 7, 8 are grounded. The foregoing description referred to the case where the semiconductor substrate 1 had a P conductivity type. However, the semiconductor substrate 1 may have an N conductivity type. Obviously in this case, it is advised to let all the layers have the opposite conductivity type to that which is described in the foregoing embodiment.

Description is now given of a semiconductor laser embodying this invention which is constructed as mentioned above. Where the first power source 7 supplies a prescribed current across the first electrode 4 and third electrode 6, then current is conducted from the first electrode 4 to the third electrode 6 through the third cladding layer 2e, second active layer 2d, second cladding layer 2c and semiconductor electrode layer 3c in turn. Where the second power source 8 supplies a prescribed current across the second electrode 5 and the third electrode 6, then the current is conducted from the second electrode 5 to the third electrode 6 through the semiconductor substrate 1, first cladding layer 2a, first active layer 2b, second cladding layer 2c and semiconductor electrode layer 3c in turn.

Where power is conducted through the aforementioned two current paths, then the semiconductor layer 3c not only acts as a common electrode having a low specific resistivity but also sometimes functions to confine light and current. In contrast, the two groups of burying layers 3a-3b and 3d-3e restrict the passage of current in current paths other than the above-mentioned two current paths due to the back bias or high resistivity of the PN junction, thereby enabling supplied current to be efficiently applied in the oscillation of laser beams. The first and second activated layers 2b, 2d are surrounded by the first and second groups of burying layers 3a-3b and 3d-3e having a smaller refractive index than said active layers 2b, 2d or sometimes by the semiconductor electrode layer 3c. In the current path, therefore, through which power is conducted from the first electrode 4 to the third electrode 6, then laser beams can be easily oscillated from the second active layer 2d with a low threshold current value. Similarly in the latter current path through which power is conducted from the second electrode 5 to the third electrode 6, laser beams can be easily oscillated from the first active layer 2b with a low threshold current value.

Further a semiconductor laser embodying this invention which is of the so-called buried type, assures the continuous oscillation of laser beams at room temperature. Further where the first and second active layers 2b, 2d are chosen to have a prescribed thickness (for example, about 0.3 micron) and a prescribed width (for example, 4 microns), then the single mode oscillation of laser beams is enabled.

Where the first and second active layers 2b, 2d are prepared from a prescribed composition, then it is possible to oscillate laser beams having the selected wavelengths. In other words, where the first and second active layers 2b, 2d have different crystal compositions, then it is possible ot oscillate two laser beams having different wavelengths. Conversely where the first and second active layers 2b, 2d have the same crystal composition, then it is possible to oscillate laser beams having the same wavelength. The second cladding layer 2c interposed between the first and second active layers 2b, 2d have its thickness reduced to such a small level as 2 to 4 microns. Therefore, two independent oscillated laser beams can be simultaneously brought into a multimode optical fiber whose core diameter measures, for example, about 50 microns.

Figure 3:
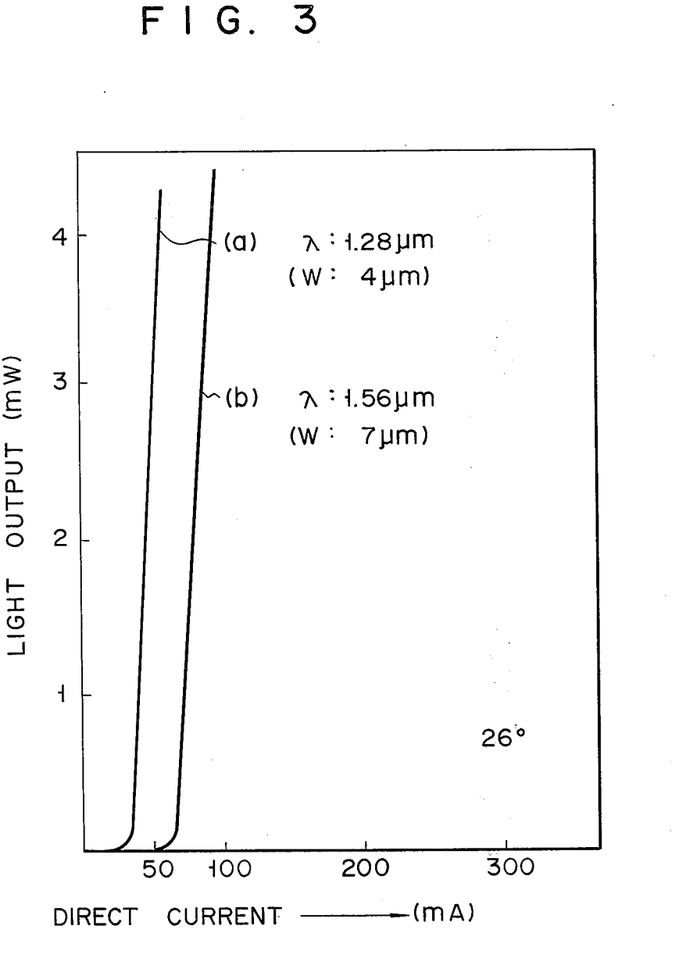
FIG. 3 graphically shows relationship between a direct current which is conducted across the prescribed electrodes of FIG. 1 and an optical output.
Figure 4:
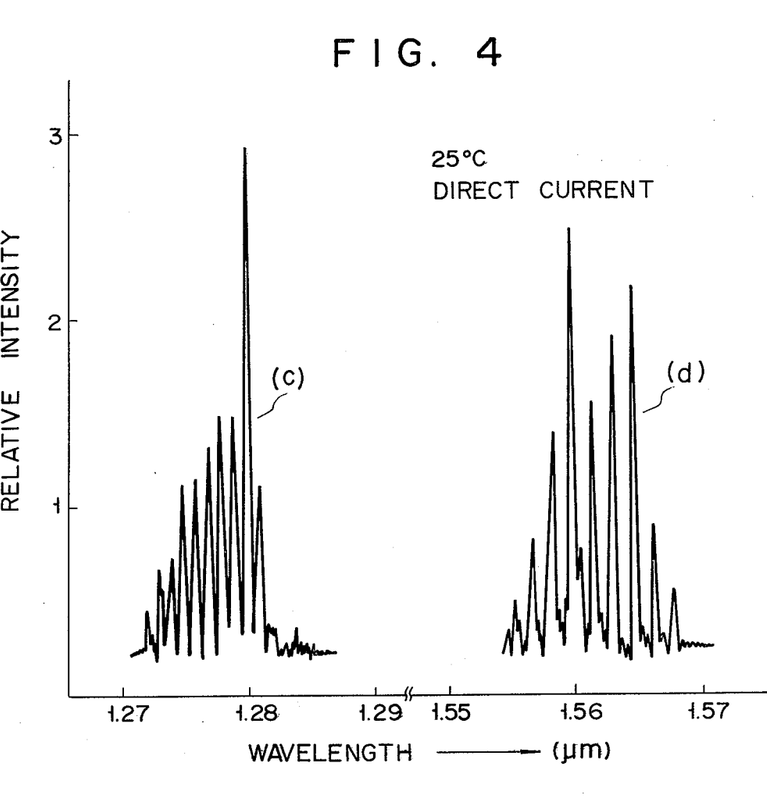
FIG. 4 is a spectrum diagram of laser light emitted from different active layers when a prescribed direct current is conducted across the specified electrodes of FIG. 1.

Description is now given with reference to FIGS. 3 and 4 of the laser beam-oscillating property of a semiconductor layer embodying this invention constructed with the undermentioned concrete design. A semiconductor substrate 1, shown in FIG. 1 is concretely designed to be formed of Zn doped P type crystals of InP with a thickness of 80 microns with a carrier density of $5 \times 10^{18}$ cm$^{-3}$. The first cladding layer 2a of the laminated layer body 2 is formed of Zn doped P type crystals of InP with a thickness of about 1.5 microns with a carrier density of $7 \times 10^{17}$ cm$-3$. The first active layer 2b deposited on the first cladding layer 2a is formed of a quarternary crystal of $Ga_xIn_{1-x}As_yP_{1-y}$ (x=0.26; y=0.56) with a thickness of about 0.15 micron.

The second cladding layer 2c mounted on the first active layer 2b is formed of Te doped N type crystals of InP with a thickness of about 3 microns with a carrier density of $5 \times 10^{17}$ cm$^{-3}$. The second active layer 2d deposited on the second cladding layer 2c is formed of quarternary crystals of $Ga_xIn_{1-x}As_yP_{1-y}$ (x=0.42; y=0.88) with a thickness of about 0.13 microns. The third cladding layer 2c laid on the second active layer 2d is formed of Zn doped P type crystals of InP with a thickness of about 2.5 microns with a carrier density of $1 \times 10^{18}$ cm$^{-3}$.

Where the laminated layer body 2 is selectively etched by etching solution, it is preferred to carry out said mesa etching to such an extent as causes the position of the once exposed surface of the semiconductor substrate 1 to be set at a point about 0.35 micron lower than an interface between the semiconductor substrate 1 and first cladding layer 2a. The first semiconductor layer 3a deposited on the prescribed region of the surface of the semiconductor substrate 1 is formed of Zn doped of P type crystals of InP with a thickness of about 1 micron with a carrier density of about $7 \times 10^{17}$ cm$^{-3}$. The second semiconductor layer 3b mounted on the prescribed region of the surface of the first semiconductor layer 3a is formed of Zn doped P type crystal InP with a thickness of 1 micron with a carrier density of $7 \times 10^{17}$ cm$^{-3}$. The semiconductor electrode layer 3c laid on the second semiconductor layer 3b is formed of N type quarternary crystals of $Ga_xIn_{1-x}As_yP_{1-y}$ (x=0.17; y=0.38) with a carrier density of $7 \times 10^{18}$ cm$^{-3}$. The third semiconductor layer 3d mounted on the semiconductor electrode layer 3c is formed of Zn doped P type crystals of InP with a thickness of about 1.5 microns with a carrier density of $4 \times 10^{17}$ cm$^{-3}$. The fourth semiconductor layer 3e deposited on the third semiconductor layer 3d is formed of Te doped N type crystals of InP with a thickness of about 1 micron by adding Te with a carrier density of $3 \times 10^{17}$ cm$^{-3}$. Where the semiconductor substrate is over mesa etched by about 0.35 microns and the respective layers are allowed to have the above-mentioned thickness, then it is possible to assure a preferred buried construction in which the first cladding layer 2a and first active layer 2b contact the first group of burying layers 3a-3b; the third cladding layer 2c contacts the semiconductor electrode layer 3c; and the second active layer 2d and third cladding layer 2e contact the second group of burying layers 3a-3b. The above-mentioned layers were fabricated at a temperature of 590° to 605° C. by liquid phase growth, using a slide boat. The mesa etching of the laminated layer body 2 including the first and second active layers 2b, 2d was effected in a bromine-methanol solution by applying a mask prepared from a silicon dioxide layer with a width of 10 microns by sputtering.

The first electrode 4 deposited on the third cladding layer 2e is an alloy of gold and zinc mixed in the ratio of 90:10 by weight. The second electrode 5 mounted on the backside of the semiconductor substrate 1 is an alloy of gold and zinc mixed in the ratio of 90:10 by weight. Where the fourth semiconductor layer 3e and third semiconductor layer 3d are partly etched off by an etchant of hydrochloric acid, then the layer of GaInAsP mounted on the semiconductor electrode layer 3c is little etched by the etchant of hydrochloric acid. Therefore, the surface of the semiconductor electrode layer 3c is exposed. The third electrode 6 formed on the exposed surface of said semiconductor electrode layer 3c is prepared from an alloy of gold-germanium-nickel mixed in the ratio of 90:5:5 by weight. In the case of mesa etching, the first active layer 2b is chosen to have a width of 4 microns and the second active layer 2d is chosen to have a width of 7 microns in view of the characteristic of said mesa etching. Where dry etching, for example, ion beam etching, is used instead of applying a bromine-methanol solution, then it is advised to fabricate the first and second active layers 2b, 2d with substantially the same width. The semiconductor laser constructed as described above was formed into an element whose cavity length measured 200 microns in length and 400 microns in width. The backside of the semiconductor substrate 1 included in said element was fitted to the surface of a metal-coated diamond heat sink by means of gold-tin solder.

Description is now given with reference to FIGS. 3 and 4 of the laser-oscillating property of the semiconductor laser of this invention constructed as described above which was observed when a prescribed amount of current was conducted between the respective electrodes of said semiconductor laser.

The heat sink was maintained at a temperature of 26° C. The second power source 8 was operated to conduct direct current from the second electrode 5 to the third electrode 6 alone. Then as indicated by curve a of FIG. 3, the first active layer 2b oscillated laser beams with a threshold current value of 43 mA and a wavelength of 1.28 microns. Where power is supplied to the first power source 7 alone, then the second active layer 2d oscillated laser beams with the threshold current valve of 61 mA and a wavelength of 1.56 microns.

Description is now given of a concrete example (though not shown). Where direct current of 58 mA was conducted from the first electrode 4 to the third electrode 6 and direct current was also supplied from the second electrode 5 to the third electrode 6, then the first active layer 2b oscillated laser beams with a threshold current valve of 49 mA. Where direct current of 40 mA was supplied from the second electrode 5 to the third electrode 6 and direct current was also delivered from the first electrode 4 to the third electrode 6, then the second active layer 2d issued laser beams with a threshold current value of 70 mA.

Further description is now given of another concrete example. Where, at a room temperature of 25° C., direct current of 55 mA was conducted from the second electrode 5 to the third electrode 6, and a direct current of 77 mA was supplied from the first electrode 4 to the third electrode 6, then the first activated layer 2b issued laser beams with 1.2 mW and a wavelength ranging approximately from 1.27 microns to 1.28 microns as indicated by curve c in FIG. 4. At this time, the second active layer 2d emitter laser beams with 0.9 mW and a wavelength ranging approximately from 1.55 microns to 1.57 microns as indicated by curve d in FIG. 4.

Further description is now given of still another concrete example, though not shown. Where direct current of 66 mA was supplied from the first electrode 4 to the third electrode 6, and direct current of 45 mA was also conducted from the second electrode 5 to the third electrode 6, and further a signal current of 100 M bit/s (amplitude: 30 mA) was supplied between the second electrode 5 and third electrode 6 as well as between the first electrode 4 and third electrode 3, then the first active layer 2b and second active layer 2d respectively issued modulated laser beams of 100 M bit/s at the same time. As described above, the semiconductor layer of this invention causes independent modulated laser beams to be simultaneously emitted from two active layers.

Figure 5:
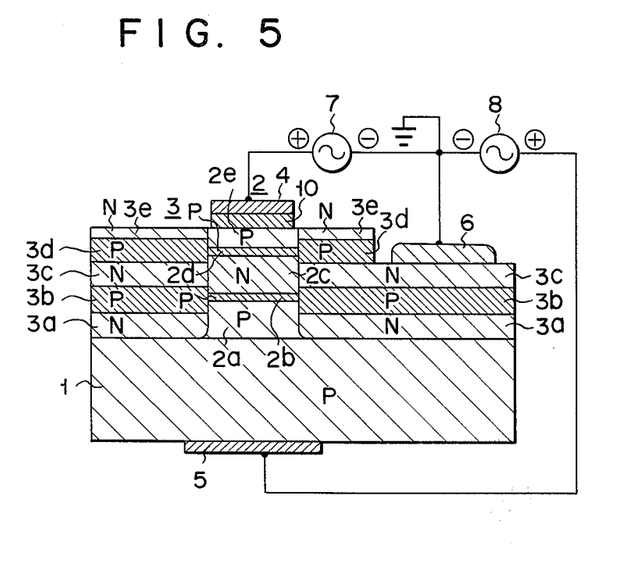
FIG. 5 is a cross sectional view of a semiconductor layer according to another embodiment of the invention, showing the connections of the respective electrodes to the power sources.

Throughout the above-mentioned embodiments, laser beams having different wavelengths were oscillated from the first active layer 2b and second active layer 2d which had different crystal compositions. Where, however, the first and second active layers 2b, 2d are chosen to have the same crystal composition, for example, $Ga_xIn_{1-x}As_yP_{1-y}$ (x=0.42; y=0.88), then laser beams having the same wavelength (1.28 microns in the above-mentioned case) are emitted from said two active layers 2b, 2d. Consequently, either of said two active layers 2b, 2d can be provided as a spare laser beam-emitting unit. One active layer, e.g., layer 2b, is used when the device is in good order, and the other active layer, e.g., layer 2d, is used when the device is out of order. Throughout the foregoing examples, the first electrode 4 was mounted on the third cladding layer 2e. However, it is possible to deposit a cap layer 10 on the third cladding layer 2e and mount the third electrode 6 on said cap layer 10, as shown in FIG. 5, in order to assure a good ohmic contact. Where the semiconductor substrate is prepared from InP, then the cap layer 10 should advisably by formed of GaInAsP. Where the semiconductor substrate is prepared from GaAs, then the cap layer 10 should advisably be formed of GaAs. The parts of FIG. 5 which are the same as those of FIG. 1 are denoted by the same numerals, description thereof being omitted.

What we claim is:

1. A semiconductor laser which comprises:
a semiconductor substrate of a first conductivity type;
a laminated layer body comprising a first cladding layer of the first conductivity type, a first active layer, a second cladding layer of a second conductivity type opposite to said first conductivity type, a second active layer and a third cladding layer of the first conductivity type all laminated in the order mentioned on a prescribed region of the surface of said semiconductor substrate as counted from said surface, both of the end surfaces of said laminated layer body comprising mirrors to form a resonant cavity;
a burying laminated layer body which is formed on the semiconductor substrate so as to surround and contact with said laminated layer body, said burying laminated layer body comprising a first burying layer, a semiconductor electrode layer of the second conductivity type and a second burying layer all laminated in the order mentioned as counted from said semiconductor substrate;
said semiconductor electrode layer substantially contacting said second cladding layer to provide a current path for a current flowing from a third electrode to said second cladding layer, and said semiconductor electrode layer having a low specific resistivity;
a first electrode coupled to said third cladding layer;
a second electrode coupled to said semiconductor substrate;
said third electrode being coupled to said semiconductor electrode layer; and
power supply means including a first power source coupled between said first and third electrodes, and a second power source coupled between said second and third electrodes.

2. A semiconductor laser which comprises:
a laminated layer body which is mounted on a prescribed region of the surface of a semiconductor substrate of a first conductivity type, said laminated layer body comprising a first cladding layer of the first conducitivity type, a first active layer, a second cladding layer of a second conductivity type opposite to the first conductivity type, a second active layer and a third cladding layer of the first conductivity type all laminated in the order mentioned as counted from said surface of said semiconductor substrate, both of the end surfaces of said laminated layer body comprising mirrors to form a resonant cavity;
a burying laminated layer body which surrounds and contacts with said laminated body, said burying laminated layer body comprising a first burying layer, a semiconductor electrode layer of a second conductivity type and a second burying layer all laminated on said surface of said semiconductor substrate in the order mentioned as counted from said surface;
said semiconductor electrode layer contacting said second cladding layer to provide a current path for a current flowing from a third electrode to said second cladding layer;
said first burying layer contacting said first cladding layer and said first active layer;
said second burying layer contacting said second active layer and said third cladding layer;
a first electrode coupled to said third cladding layer;
a second electrode coupled to said semiconductor substrate;
said third electrode being coupled to said semiconductor electrode layer; and
power supply means including a first power source coupled between said first and third electrodes, and a second power source coupled between said second and third electrodes.

3. The semiconductor laser according to claim 1 or 2, wherein said semiconductor electrode layer has a smaller refractive index than said first and second active layers.

4. The semiconductor laser according to claim 3, wherein said semiconductor electrode layer has a wider forbidden band gap than said first and second active layers.

5. The semiconductor laser according to claim 1 or 2, wherein said first and second active layers have a narrower forbidden band gap than said first to third cladding layers and first and second burying layers; and said first and second active layers have a larger refractive index than said first to third cladding layers and first and second burying layers.

6. The semiconductor laser according to claim 1 or 2, wherein
said first burying layer comprises a first semiconductor layer of the second conductivity type and a second semiconductor layer of the first conductivity type laminated on each other in the order mentioned as counted from said surface of said semiconductor substrate to jointly constitute a first PN junction; and
said second burying layer comprises a third semiconductor layer of the first conductivity type and a fourth semiconductory layer of the second conductivity type laminated on each other in the order mentioned as counted from the surface of the semiconductor substrate to jointly constitute a second PN junction.

7. The semiconductor laser according to claim 1 or 2, wherein said first and second burying layers each comprise at least one semiconductor layer of high resistivity.

8. The semiconductor laser according to claim 1 or 2, wherein said first and second active layers have different chemical compositions.

9. The semiconductor laser according to claim 1 or 2, wherein said first and second active layers have the same chemical composition.

10. The semiconductor laser according to claim 1 or 2, wherein said semiconductor substrate is a semiconductor containing any of the compounds belonging to Groups III and V of the periodic Table.

11. The semiconductor laser according to claim 10, wherein said semiconductor is InP.

12. The semiconductor laser according to claim 10, wherein said semiconductor is GaAs.

13. The semiconductor laser according to claim 10, wherein said first to third cladding layers and said first and second burying layers are InP; and said first and second active layer are GaInAsP.

14. The semiconductor laser according to claim 13, wherein said semiconductor electrode layer is GaInAsP.

15. The semiconductor laser according to claim 13, wherein said semiconductor electrode is InP.

16. The semiconductor laser according to claim 11, wherein said first to third cladding layers and said first and second burying layers are GaAlAs; and said first and second active layers are GaAs.

17. The semiconductor laser according to claim 16, wherein said semiconductor electrode layer is GaAs.

18. The semiconductor laser according to claim 16, wherein said semiconductor electrode layer is GaAlAs.

19. The semiconductor laser according to claim 1 or 2, wherein said first electrode is mounted on said third cladding layer with a cap layer interposed therebetween.

* * * * *